US006998455B1

(12) United States Patent
Ohta et al.

(10) Patent No.: US 6,998,455 B1
(45) Date of Patent: Feb. 14, 2006

(54) LAMINATE AND PROCESS FOR PRODUCING THE SAME

(75) Inventors: Takuhei Ohta, Chiba (JP); Katsufumi Hiraishi, Chiba (JP); Makoto Shimose, Chiba (JP); Kazuto Okamura, Chiba (JP); Naoya Okabayashi, Chiba (JP); Kazunori Oomizo, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 375 days.

(21) Appl. No.: 10/110,316

(22) PCT Filed: Oct. 20, 2000

(86) PCT No.: PCT/JP00/07330

§ 371 (c)(1),
(2), (4) Date: Apr. 11, 2002

(87) PCT Pub. No.: WO01/28767

PCT Pub. Date: Oct. 20, 2000

(30) Foreign Application Priority Data

Oct. 21, 1999  (JP) .................................. 11/299443

(51) Int. Cl.
*C08F 122/40*  (2006.01)

(52) U.S. Cl. .................... 526/310; 526/317.1; 526/347

(58) Field of Classification Search ............. 526/317.1, 526/310, 347
See application file for complete search history.

(56) References Cited

FOREIGN PATENT DOCUMENTS

| JP | 60-243120 | | 12/1985 |
|---|---|---|---|
| JP | 61-111181 | | 5/1986 |
| JP | 61-143434 | | 7/1986 |
| JP | 3-123093 | | 5/1991 |
| JP | 3-104185 | | 7/1991 |
| JP | 3-164240 | | 7/1991 |
| JP | 03-164240 | * | 7/1991 |
| JP | 4-144741 | | 5/1992 |
| JP | 04-144741 | * | 5/1992 |
| JP | 06-93537 B2 | * | 11/1994 |
| JP | 10-126019 | | 5/1998 |
| JP | 10-298286 | | 11/1998 |
| JP | 11-054862 | | 2/1999 |

OTHER PUBLICATIONS

International Search Report PCT/JP00/07330 mailed on Jan. 23, 2001.

* cited by examiner

*Primary Examiner*—Ling-Sui Choi
(74) *Attorney, Agent, or Firm*—Rader, Fishman & Grauer PLLC

(57) ABSTRACT

This invention relates to a laminate which changes in dimension to such a small extent as not to cause curling and warpage when the ambient humidity changes and is useful for flexible printed wiring boards. The laminate possesses a polyimide layer or layers of polyimides formed on a conductor by coating and at least one of the polyimide layers is composed of polyimide of low hygroscopic expansion obtained by the reaction of diamines containing 20 mol % or more of 4,4'-diamino-2,2'-dimethylbiphenyl with a tetracarboxylic acid compound and exhibiting a coefficient of linear hygroscopic expansion of $15 \times 10^{-6}$/% RH or less.

11 Claims, No Drawings

LAMINATE AND PROCESS FOR PRODUCING THE SAME

FIELD OF TECHNOLOGY

This invention relates to laminates which are useful for flexible printed wiring boards and HDD suspensions and to a process for producing the same.

BACKGROUND TECHNOLOGY

Laminates for use in flexible printed wiring boards and HDD suspensions have been produced so far by pasting a polyimide or polyester film on a conductor by the use of an adhesive. However, the laminates produced in this manner presented problems such as lowered heat resistance and fire retardance because of the presence of an adhesive layer. Moreover, they suffered a large dimensional change when the conductor was etched or some sort of heat treatment was applied to them and this dimensional change was an obstacle in later manufacturing steps.

To solve the aforementioned problems, a process is disclosed in JP6-93537B for providing a base material for a flexible printed wiring board which is highly reliable in respect to dimensional stability against temperature change, adhesive strength and post-etching planarity by coating a conductor directly with polyimide and forming an insulator composed of plural layers of polyimides differing one another in the coefficient of thermal expansion. However, this patent takes no interest in the coefficient of hygroscopic expansion of polyimide in use and, in the cases where the polyimide layers in the base material exhibit a high coefficient of hygroscopic expansion, there arose a problem of the base material suffering a loss in dimensional stability by a change in ambient moisture, even though unaffected by a thermal change. That is, a polyimide layer exhibiting a high coefficient of hygroscopic expansion not only causes such troublesome phenomena as warpage, curling and twisting of the laminate as the ambient humidity changes but also degrades the electrical properties of the laminate after fabrication of a circuitry.

Therefore, there is a demand for development of laminates which change little dimensionally as the ambient humidity changes or laminates exhibiting a low coefficient of hygroscopic expansion.

An object of this invention is to provide a humidity-resistant laminate comprising a polyimide layer formed by coating and exhibiting a low coefficient of hygroscopic expansion and to provide a process for producing the same. Another object of this invention is to provide a humidity-resistant laminate comprising a resilient conductor layer required for maintaining a certain minute gap in such a device as an HDD suspension.

DISCLOSURE OF THE INVENTION

The present inventors have conducted intensive studies to solve the aforementioned themes, found that even a laminate possessing a resin layer formed by coating undergoes small dimensional changes against changes in ambient humidity if a material of specified structure is used for the constituent polyimide layers and a coating method suitable for the material is devised, and completed this invention.

In a laminate possessing a layer or layers of polyimides formed by coating on a conductor, this invention relates to a laminate wherein at least one of the polyimide layers is a polyimide layer of low hygroscopic expansion obtained by the reaction of diamines containing 20 mol % or more of 4,4'-diamino-2,2'-dimethylbiphenyl with a tetracarboxylic acid compound and exhibiting a coefficient of linear hygroscopic expansion of $20 \times 10^{-6}$/% RH or less. Furthermore, this invention relates to the aforementioned laminate wherein the polyimide layer has a multilayer structure composed of at least two layers, one being a polyimide layer of low hygroscopic expansion with a coefficient of linear hygroscopic expansion of $20 \times 10^{-6}$/% RH or less and the other being a polyimide layer of high thermal expansion with a coefficient of linear thermal expansion of $30 \times 10^{-6}$/° C. or more, and the polyimide layer of high thermal expansion exists in contact with the conductor layer. Still more, this invention relates to either of the aforementioned laminates wherein the polyimide layer has a three-layer structure composed of a polyimide layer of high thermal expansion, a polyimide layer of low hygroscopic expansion and a polyimide layer of high thermal expansion. The polyimide layer of low hygroscopic expansion is preferably a layer of polyimide containing 20 mol % or more of the structural unit represented by the following formula (1) and/or formula (2).

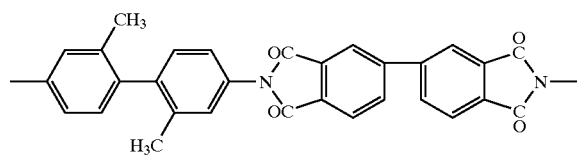

(1)

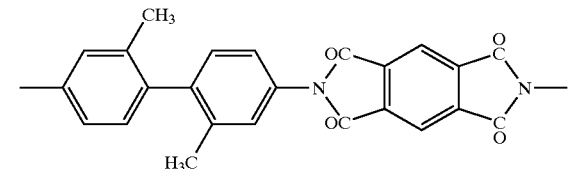

(2)

What is more, this invention relates to a process for producing a laminate possessing a layer or layers of polyimides formed on a conductor which comprises steps for coating a conductor with a solution of polyimide precursor or polyimide obtained by the reaction of diamines containing 20 mol % or more of 4,4'-diamino-2,2'-dimethylbiphenyl with a tetracarboxylic acid compound, drying the solution and giving heat treatment at a temperature above 200° C. thereby forming a polyimide layer of low hygroscopic expansion with a coefficient of linear hygroscopic expansion of $20 \times 10^{-6}$/% RH or less. Moreover, this invention relates to a process for producing the aforementioned laminate which comprises coating a conductor successively with a solution of resin precursor or resin capable of forming a polyimide layer of high thermal expansion with a coefficient of linear thermal expansion of $30 \times 10^{-6}$/° C. or more and another solution of resin precursor or resin capable of forming a polyimide layer of low hygroscopic expansion with a coefficient of linear hygroscopic expansion of $20 \times 10^{-6}$/% RH or less while applying each solution once or more times, drying the solutions to form plural layers of resins, heating the layers of resins at a temperature above 200° C. and forming a polyimide layer composed of at least one layer of polyimide of low hygroscopic expansion with a coefficient of linear hygroscopic expansion of $20 \times 10^{-6}$/% RH or less. Still more, this invention relates to a process for producing a double-sided laminate possessing conductors on both sides which comprises coating a conductor successively with a solution of resin precursor or resin as in the aforementioned process for producing a laminate so that polyimide of high thermal expansion constitutes both the layer in contact with the conductor layer and the surface layer, drying to form plural layers of resins, giving heat treatment at a temperature above 200° C. to form a single-sided laminate with the conductor only on one side and heat-bonding another conductor layer to the single-sided laminate.

The laminate of this invention contains at least one layer of polyimide of low hygroscopic expansion on the conductor layer. Moreover, it is advantageous that the laminate of this invention contains at least one layer of polyimide of low hygroscopic expansion on the conductor layer and, in addition, contains at least one layer of polyimide of high thermal expansion in contact with the conductor layer.

The property of low hygroscopic expansion in this invention means a coefficient of linear hygroscopic expansion of $20 \times 10^{-6}/\%$ RH or less. The coefficient of linear hygroscopic expansion is occasionally simplified to the coefficient of hygroscopic expansion. The coefficient of linear hygroscopic expansion is determined by measuring the length along the major axis of a strip of resin film, 15 mm×3 mm in size, at 25° C. and at relative humidity (RH) of 25% and 80% or $L_2$, and $L_{80}$, determining the difference between the two or $L$ (cm)=$L_{80}$–$L_{25}$, and calculating the coefficient as follows: $L$ (cm)×1/1.5 (cm)×1/(80–25) (% RH).

Concretely, the dimensional changes along the major axis of the specimen film are measured at 25° C. and at relative humidity 25% and 80% by the combined use of a thermomechanical analyzer (a product of Seiko Instruments Inc.) and a humidity controller (a product of Seiko Instruments Inc.) for the thermomechanical analyzer and the rate of dimensional change per 1 cm and 1% RH is determined as the coefficient of linear hygroscopic expansion. In case the specimen is a resin layer formed on a conductor layer, a resin film obtained by stripping the conductor layer by such means as etching may be used as the specimen film. The specimen representing the resin layer to be prepared by the process of this invention is formed under the same conditions as in the process of this invention by coating the conductor with a solution of resin precursor or resin, drying and heating. The resulting resin layer is placed in a room at normal temperature and cut into a piece of the specified size and, if necessary, of the specified thickness. In case the resin layer is multilayer, the whole layer or individual layers can be tested in the same manner.

The property of high thermal expansion means a coefficient of linear thermal expansion of $30 \times 10^{-6}/°$ C. or more. The coefficient of linear thermal expansion is determined by heating a resin film to 250° C., cooling the film at a rate of 10° C./min and calculating the mean rate of linear expansion between 240° C. and 100° C. The coefficient of linear thermal expansion is also simplified to the coefficient of thermal expansion. Concretely, the sufficiently imidized specimen is heated to 255° C., kept at this temperature for 10 minutes and cooled at a rate of 5° C./min by the use of a thermomechanical analyzer (a product of Seiko Instruments Inc.) and the mean rate of thermal expansion between 240° C. and 100° C. is calculated and taken as the coefficient of linear thermal expansion.

The laminate of this invention has at least one polyimide layer of low hygroscopic expansion on the conductor layer and the laminate tends to warp as the ambient humidity changes if the coefficient of hygroscopic expansion exceeds $20 \times 10^{-6}/\%$ RH. To prevent this warpage, the coefficient of hygroscopic expansion is kept at $18 \times 10^{-6}/\%$ RH or less, preferably at $15 \times 10^{-6}/\%$ RH or less, more preferably $10 \times 10^{-6}/\%$ RH or less. The coefficient of hygroscopic expansion of metals to be used as conductors is generally 0 or nearly 0 and, from the viewpoint of prevention of warpage, the more advantageous the resin layer the closer its coefficient of hygroscopic expansion to 0. However, the resin layer is adequate if it satisfies the aforementioned values of the coefficient of hygroscopic expansion.

Polyimides of low hygroscopic expansion useful for this invention are polyimides obtained by the reaction of diamines containing 20 mol % or more, preferably 50 mol % or more, more preferably 70 mol % or more, of 4,4'-diamino-2,2'-dimethylbiphenyl (hereinafter also referred to as DADMB) with a tetracarboxylic acid compound. It is desirable that the polyimides in question contain 20 mol % or more, preferably 50 mol % or more, more preferably 70 mol % or more, of the structural unit represented by the aforementioned formula (1) and/or formula (2).

Polyimides as used in this invention are polymers containing the imide group in their structure such as polyimides, polyamideimides, polyetherimides, polyesterimides, polysiloxaneimides and polybenzimidazoleimides.

Polyimides of low hygroscopic expansion useful for this invention can be prepared by a know method while satisfying one condition that diamines in use contain 20 mol % or more of DADMB. For example, starting with a tetracarboxylic acid compound and diamines in nearly equimolar quantities, polyimides are prepared in two steps by the synthesis of polyamic acids or the precursors of polyimides in solution followed by the imidation of polyamic acids. Tetracarboxylic acid compounds include tetracarboxylic acids and their acid anhydrides, esters and halides and acid anhydrides are preferable because of the ease of synthesis of polyamic acids. As long as polyimides to be obtained exhibit the property of low hygroscopic expansion, there is no restriction on diamines other than the use of DADMB and on tetracarboxylic acid compounds. It has been found that the coefficient of hygroscopic expansion decreases as the amount of DADMB used increases and polar substituents do not affect the coefficient of hygroscopic expansion significantly when their number is kept as small as possible. On the basis of this finding, it is easy to find the way to obtain the object polyimide of low hygroscopic expansion by a simple experiment. Preferably, the polyimide in question contains 20 mol % or more of the structural unit represented by the aforementioned formula (1) and/or formula (2) and the remaining structural units are also preferably those resulting from aromatic tetracarboxylic acid compounds and aromatic diamines.

The aforementioned aromatic diamines are suitably represented by $H_2N$—Ar—$NH_2$. The group Ar here is represented by the following formulas (5) and (6) and the amino groups are preferably located at p, p'-positions, although not restricted thereto. The group Ar may have substituents but preferably it has none or a lower alkyl or alkoxy group with 5 or less carbon atoms.

(5)

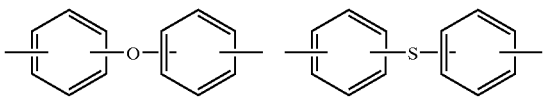

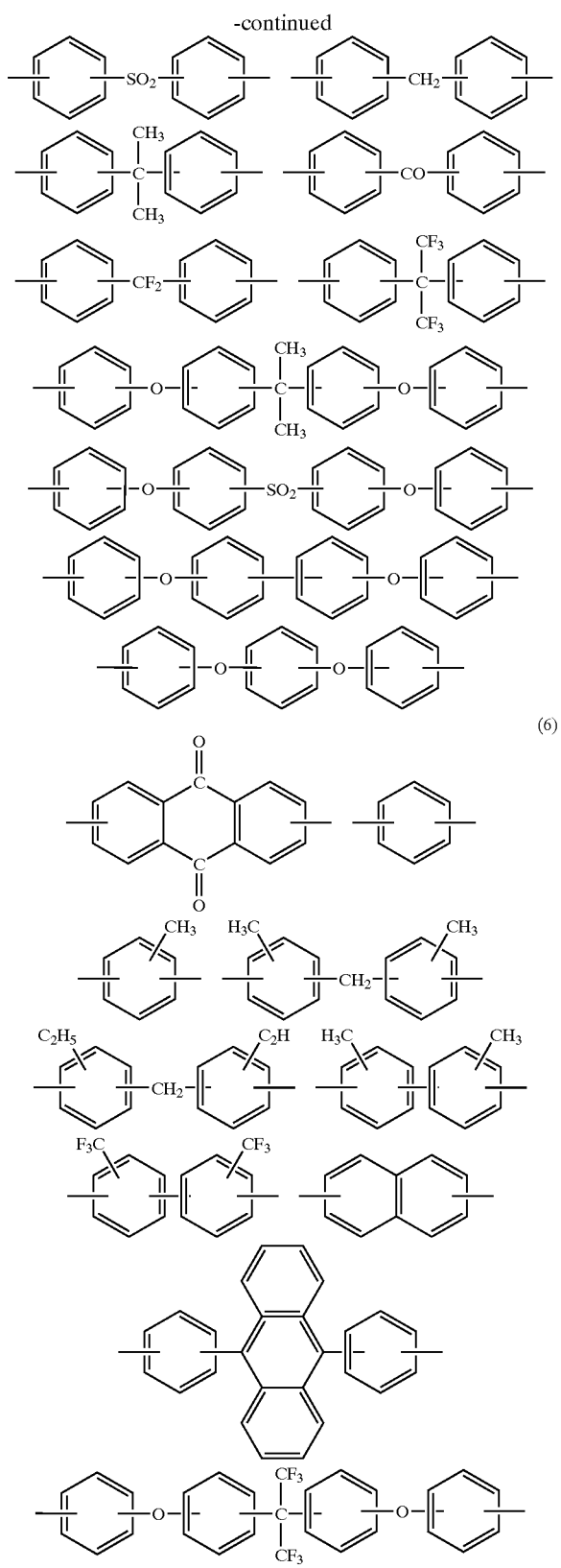

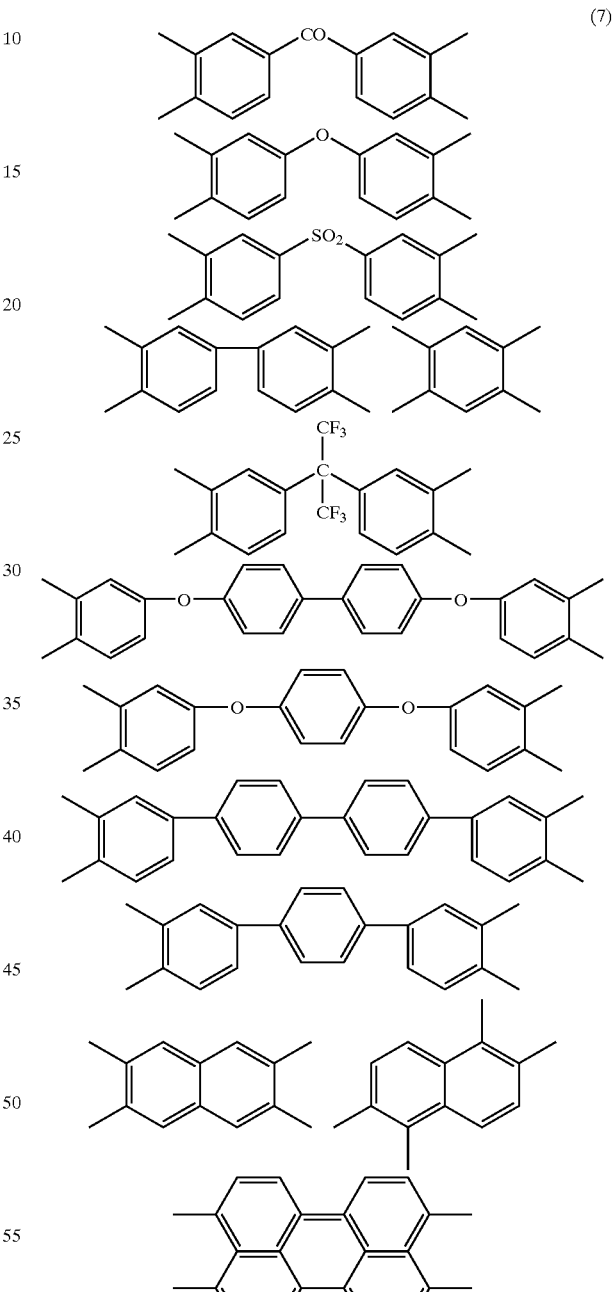

The aforementioned aromatic tetracarboxylic acid compounds are suitably represented by $O(OC)_2Ar'(CO)_2O$. The group Ar' here is a tetravalent aromatic group represented by the following formula (7) and the two acid anhydride groups $[O(OC)_2]$ may be located at any positions, preferably symmetrically. The group Ar' may contain a substituent, but preferably none or a lower alkyl group. Preferable aromatic tetracarboxylic acid compounds are biphenyltetracarboxylic acid dianhydride or pyromellitic dianhydride.

The synthesis of polyimides is generally performed as follows: diamines and acid anhydrides are mixed in nearly equimolar quantities in a solvent such as N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenol, cyclohexanone, dioxane, tetrahydrofuran, diglyme and triglyme, the mixture is allowed to react at a temperature in the range of 0–200° C., preferably 0–100° C., to give a solution of the precursor of polyimide, and the precusor is imidized.

The imidation may be carried out by applying the precursor solution to the conductor followed by drying and heat treatment or the precursor solution is imidized and the resulting polyimide solution is applied to the conductor, dried and given heat treatment.

The lamination to the conductor is carried out by forming a layer of the polyimide precursor or a layer of polyimide on the conductor, drying and, in the case of the polyimide precursor, giving heat treatment at 200° C. or more, preferably 300° C. or more, to effect imidation. In case the resin layer is multilayer, plural layers of polyimides can be formed on the conductor by coating the conductor with the resin solution followed by drying as in the formation of a single layer and repeating this step or by carrying out multilayer coating at one time by the use of a multilayer die followed by drying. The thickness of a resin layer of low hygroscopic expansion constituting at least one of resin layers is preferably 3–75 μm in consideration of the whole structure of the laminate. In particular, any thickness in the range is suited when applied to flexible printed wiring boards and HDD suspensions.

Usually, it is frequently the case that a solution of polyamic acids is applied to a base material such as a conductor layer, dried and further subjected to heat treatment at high temperature. However, when the imidized product shows good solubility in the solvent, it is possible to effect imidation of the polyamic acid solution by heating and use a solution of polyimide thereby produced as coating solution. It is possible to add an amine such as pyridine and quinoline or acetic anhydride to accelerate the imidation reaction. Furthermore, it is possible to incorporate additives such as fillers and silane coupling agents in polyimide if necessary.

The conductor layer to be used in the laminate of this invention may be chosen from copper, aluminum, stainless steel, iron, silver, palladium, nickel, chromium, molybdenum, tungsten and their alloys, copper being preferable. A resilient material suitable for use in HDD suspensions is stainless steel. The thickness of the conductor layer is not restricted and a conductor with a thickness of 3–70 μm, particularly 10–50 μm, is used preferably in flexible printed wiring boards and HDD suspensions. These conductors may be surface-treated chemically or mechanically for improved adhesive strength by the use of sizing, nickel plating, copper-zinc alloy plating, aluminum alcoholates, aluminum chelates, silane coupling agents, triazinethiols, benzotriazoles, acetyl alcohols, acetylacetones, catechols, o-benzoquinones, tannins, and quinolinols.

In order to prevent warpage of the laminate, it is naturally important for the coefficient of humid expansion to be low and, besides, the difference in thermal expansion between the conductor such as a metal foil and the polyimide layer should desirably be small. As the coefficient of thermal expansion of conductors such as metal foils is generally lower than that of resins, the resins in use should desirably exhibit the property of low thermal expansion as well. The coefficient of thermal expansion is preferably $30 \times 10^{-6}/°$ C. or less for polyimides.

It has been found that polyimides of low hygroscopic expansion of this invention can simultaneously be polyimides of low thermal expansion. Polyimides of low thermal expansion are known in a large number of patents and literatures and this property can be controlled by a proper combination of diamines and tetracarboxylic acid compounds. Since DADMB is one kind of diamine which gives polyimide of low thermal expansion, it is easy to obtain polyimides possessing both properties of low hygroscopic expansion and low thermal expansion by controlling the amount of DADMB used and selecting diamines and tetracarboxylic acid compounds publicly known to give polyimides of low thermal expansion.

Suitable selection of a structure mainly composed of polyimide or polyimideamide having the structural unit represented by the following general formula (3) or (4) (wherein $Ar_1$ is a divalent aromatic group and $Ar_2$ is a tetravalent aromatic group) for polyimides other than those containing 20 mol % or more of the structural unit represented by the aforementioned formula (1) and/or formula (2) makes it possible to control the coefficient of linear thermal expansion of the conductor at the value demanded in practice or $30 \times 10^{-6}/°$ C. or less. The control of the coefficient of linear thermal expansion in this manner can prevent occurrence of warpage, curling and twisting when heat is added to a laminate composed of an insulating polyimide layer and a conductor.

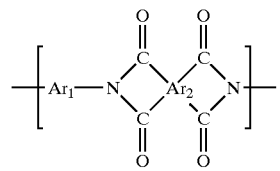

(3)

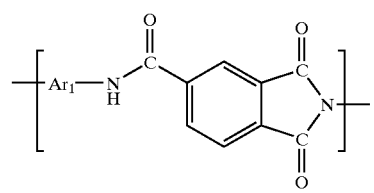

(4)

The aforementioned group $Ar_1$ may be represented by formulas (5) and (6) like the group Ar mentioned earlier, and, likewise, $Ar_2$ may be represented by formula (7) like Ar'.

A procedure often adopted for improvement of a variety of properties such as adhesiveness to the conductor and heat resistance is to make the resin layer multilayer. In such a case, it is desirable that the plural layers as a whole show low hygroscopic expansion and low thermal expansion; as for the property of low hygroscopic expansion in this invention, it is satisfactory if at least one layer exhibits a coefficient of hygroscopic expansion below the aforementioned value.

In particular, the adhesive strength between the conductor and the resin layer is an important property and it is desirable that the adhesive strength expressed as 90° peel strength is 1 kgf/cm or more at normal temperature or 0.8 kgf/cm or more at 150° C. Generally, polyimides of high thermal expansion show a tendency to develop relatively good adhesive strength to metals to be used as conductors while polyimides of low thermal expansion do not necessarily show such a tendency. In case polyimide of both low hygroscopic expansion and low thermal expansion is used, it is advantageous to provide plural layers of polyimides by the simultaneous use of polyimide of high thermal expansion in order to raise the adhesive strength. In this case, there is the possibility of the hygroscopic expansion and thermal expansion of the resin layers as a whole going up; however, the thickness of a layer required for improved adhesiveness is not very much and the thickness of a polyimide layer of high thermal expansion is made ⅓ or less, preferably ¼–1/20, of that of the resin layers as a whole. Moreover, in the case of simultaneous use of polyimide of high thermal expansion for improved adhesiveness, it is advisable to place polyimide of high thermal expansion in contact with the conductor.

Such being the case, a preferable arrangement of the polyimide layers in the humidity-resistant laminate of this invention is a multilayer structure containing at least two polyimide layers, one of low hygroscopic expansion acceptable to practical use and another of high thermal expansion, and the latter exists in contact with the conductor layer.

A more preferable arrangement of the laminate of this invention is a three-layer structure composed of polyimide of high thermal expansion/polyimide of low hygroscopic expansion/polyimide of high thermal expansion. The two kinds of polyimides of high thermal expansion may be identical with or different from each other and the coefficient of linear thermal expansion of the polyimide of low hygroscopic expansion is preferably $25 \times 10^{-6}/°$ C. or less. In case the polyimide layer is multilayer, it is advantageous to control the coefficient of hygroscopic expansion of the resin layers as a whole at $20 \times 10^{-6}/\%$ RH or less, preferably $15 \times 10^{-6}/\%$ RH or less, and the coefficient of linear thermal expansion at $25 \times 10^{-6}/°$ C. or less.

Polyimides of high thermal expansion are preferably composed mainly of polyimides or polyamideimides containing the structural units represented by the aforementioned general formulas (3) and (4) from the viewpoint of heat resistance.

The groups $Ar_1$ and $Ar_2$ here include the aforementioned examples and, as disclosed in JP3-123093A and elsewhere, proper selection of such groups can yield polyimides of high thermal expansion. Polyimides of high thermal expansion desirably show such adhesiveness as to satisfy the specified peel strength.

The laminate of this invention can be prepared by the use of a number of coating procedures. In case the laminate has plural resin layers, the following three procedures are preferable in consideration of coating accuracy.

(1) To apply two kinds or more of polyimide solutions or polyimide precursor solutions simultaneously to the conductor by the use of a multilayer die.

(2) To apply a coating to the conductor by an optional procedure and then apply a coating further to the wet coated surface by knife coating or die coating.

(3) To apply a coating to the conductor by an optional procedure, dry the coating and apply a coating further to the dried coated surface by an optional procedure.

Knife coating here refers to a procedure according to which a resin solution is smoothed by a bar, squeegee or knife and applied.

The procedure for drying and curing is optional and a variety of procedures are applicable. A practice generally adopted is to apply a polyimide solution or a polyimide precursor solution to a laminate and submit the laminate containing the preliminarily dried uncured polyimide precursor solution to heat treatment at high temperature (200° C. or more) by either placing the laminate in a hot-air oven at the specified temperature for the specified length of time or moving the laminate continuously inside a drying oven while securing the specified length of time for drying and curing.

Moreover, a batch process is conceivable in consideration of such factors as operational efficiency and yield; a solution of polyimide precursor or polyimide is applied to a laminate and the preliminarily dried uncured laminate is wound into a roll and further submitted to drying and curing at high temperature. In the practice of this batch process, it is desirable to carry out the heat treatment at high temperature (200° C. or more) under reduced pressure, in an atmosphere of reducing gas or in a reduced-pressure atmosphere of reducing gas for the purpose of preventing the oxidation of the conductor.

In the course of drying and curing, a solution of polyimide or its precursor is applied to a conductor such as a metal foil uniformly and the conductor is stripped of the solvent by heat treatment and, where the polyimide precursor is used, the ring closure to imide takes place during the heat treatment. When the heat treatment is effected rapidly at high temperature, a layer of skin forms on the resin surface which interferes with smooth evaporation of the solvent or causes foaming. For this reason, it is desirable to effect the heat treatment by raising the temperature gradually.

The laminate of this invention can be made a double-sided laminate possessing conductor layers on both sides of the resin layer. In order to prepare a laminate of this double-sided structure, a solution of polyimide precursor or polyimide is applied to a conductor, dried and cured and another conductor is hot-pressed to the cured laminate. Hot-pressing can be performed in the usual manner by the use of a hydropress, a vacuum-type hydropress, autoclaving vacuum press and a continuous thermal laminator. Preferable among them is a hydropress which provides sufficient pressing pressure, strips the residual volatiles readily and prevents the oxidation of conductors such as metal foils.

The hot-pressing temperature is not restricted, but it is desirably above the glass transition temperature of polyimide in use. The pressure during hot pressing is suitably 1–500 kg/cm², although it depends on the kind of hot press in use.

When hot pressing is performed by the use of a hydropress, it is possible to prepare a multi layers laminates in one hot-pressing operation by making single-sided conductor-polyimide laminates and conductor layers ready, each in the form of a sheet, stacking up the two in several layers and hot-pressing them simultaneously under heat and pressure.

Another procedure to prepare a double-sided laminate possessing conductor layers on both sides is to make two laminates ready, each having either a structure of conductor/resin of high thermal expansion/resin of low hygroscopic expansion/resin of high thermal expansion or a structure of conductor/resin of high thermal expansion/resin of low hygroscopic expansion, and pressing the two together with the resin sides facing each other. From the viewpoint of securing sufficient adhesive strength between the two resin layers, it is desirable to use the former laminate having the structure of conductor/resin of high thermal expansion/resin of low hygroscopic expansion/resin of high thermal expansion.

PREFERRED EMBODIMENTS OF THE INVENTION

This invention will be described concretely with reference to the accompanying examples and comparative examples. A variety of properties in the examples are evaluated by the following methods. Polyimide obtained after sufficient imidation was used as a specimen.

The coefficient of linear hygroscopic expansion was determined by the combined use of a thermomechanical analyzer (a product of Seiko Instruments Inc.) and a humidity controller (a product of Seiko Instruments Inc.) for the thermomechanical analyzer according to the procedure mentioned earlier.

The coefficient of linear thermal expansion was determined by heating a specimen to 255° C., keeping it at this temperature for 10 minutes, thereafter cooling it at a rate of 5° C./min and calculating the mean rate of thermal expansion (coefficient of linear thermal expansion) between 240° C. and 100° C. by the use of a thermomechanical analyzer (a product of Seiko Instruments Inc.).

Warpage is evaluated as follows: a square laminate, 5 cm×5 cm, is left overnight in an environment of 23° C. and 50% RH, the height of warpage at four corners of the laminate is measured and the average value A is calculated; thereafter, the laminate is left in an environment of 23° C. and 80% RH for 5 hours, the height of warpage at four corners of the laminate is measured likewise and the average value B is calculated; the difference between A and B is used to obtain a change in warpage in response to a change in ambient humidity.

The symbols used in the examples and elsewhere designate the following compounds:
MABA: 4,4'-Diamino-2'-methoxybenzanilide
DAPE: 4,4'-Diaminodiphenyl ether
BAPB: 4,4'-Bis(3-aminophenoxy)biphenyl
BAPP: 2,2'-Bis[4-(4-aminophenoxy)phenyl]propane
DADMB: 4,4'-Diamino-2,2'-dimethylbiphenyl
PPD: Para-phenylenediamine
PMDA: Pyromellitic dianhydride
BPDA: 3,3',4,4'-Biphenyltetracarboxylic acid dianhydride
6FDA: 4,4'-(Hexafluoroisopropylidene)diphthalic acid dianhydride
DMAc: N,N-Dimethylacetamide

SYNTHETIC EXAMPLE 1

In a 1 L separable flask was placed 425 g of DMAc and 23.87 g (112.44 mmol) of DADMB and 10.36 g (28.12 mmol) of BAPB were dissolved in the DMAc with stirring. Thereafter, 40.20 g (136.63 mmol) of BPDA was added to the solution while passing a stream of nitrogen. The mixture was then allowed to polymerize at room temperature for 5 hours with stirring to give a solution of polyimide precursor A which showed an apparent viscosity of 350 poises at 25° C. when measured by an E-type viscometer.

SYNTHETIC EXAMPLE 2

In a 1 L separable flask was placed 425 g of DMAc and 31.53 g (148.37 mmol) of DADMB was dissolved in the DMAc with stirring. Thereafter, 43.21 g (146.87 mmol) of BPDA was added to the solution while passing a stream of nitrogen. The mixture was then allowed to polymerize for 5 hours with stirring to give a solution of polyimide precursor B which showed an apparent viscosity of 361 poises at 25° C. when measured by an E-type viscometer.

SYNTHETIC EXAMPLE 3

In a 1 L separable flask was placed 425 g of DMAc and 35.15 g (165.57 mmol) of DADMB was dissolved in the DMAc with stirring. Thereafter, 7.25 g (16.32 mmol) of 6FDA and 32.04 g (146.89 mmol) of PMDA were added to the solution while passing a stream of nitrogen. The mixture was then allowed to polymerize for 2 hours with stirring to give a solution of polyimide precursor C which showed an apparent viscosity of 280 poises at 25° C. when measured by an E-type viscometer.

SYNTHETIC EXAMPLE 4

In a 1 L separable flask was placed 425 g of DMAc and 30.62 g (144.23 mmol) of DADMB and 1.08 g (2.93 mmol) of BAPB were dissolved in the DMAc with stirring. Thereafter, 42.69 g (145.10 mmol) of BPDA was added to the solution. The mixture was then allowed to polymerize for 5.5 hours with stirring to give a solution of polyimide precursor D which showed an apparent viscosity of 282 poises at 25° C. when measured by an E-type viscometer.

SYNTHETIC EXAMPLE 5

In a 1 L separable flask was placed 425 g of DMAc and 43.15 g (105.11 mmol) of BAPP was dissolved in the DMAc with stirring. Thereafter, 31.85 g (108.25 mmol) of BPDA was added to the solution. The mixture was then allowed to polymerize for 4.5 hours with stirring to give a solution of polyimide precursor E which showed an apparent viscosity of 45 poises at 25° C. when measured by an E-type viscometer.

SYNTHETIC EXAMPLE 6

In a 130 L stainless steel vessel was placed 110.5 kg of DMAc and 6,651.3 g (25.85 mol) of MABA and 3,450.9 g (17.23 mol) of DAPE were dissolved in the DMAc with stirring. Thereafter, 9,266.2 g (42.48 mol) of PMDA was added to the solution. The mixture was then allowed to polymerize for 2.5 hours with stirring to give a solution of polyimide precursor F which showed an apparent viscosity of 270 poises at 30° C. when measured by a B-type viscometer.

SYNTHETIC EXAMPLE 7

In a 40 L stainless steel vessel was placed 31,841 g of DMAc and 2,222.44 g (10.468 mol) of DADMB and 78.71 g (0.2137 mol) of BAPB were dissolved in the DMAc with stirring. Thereafter, 3,098.86 g (10.532 mol) of BPDA was added to the solution. The mixture was then allowed to polymerize for 4 hours with stirring to give a solution of polyimide precursor G which showed an apparent viscosity of 250 poises at 25° C. when measured by a B-type viscometer.

SYNTHETIC EXAMPLE 8

In a 40 L stainless steel vessel was placed 17,386 g of DMAc and 1,294.43 g (3.153 mol) of BAPP was dissolved in the DMAc with stirring. Thereafter, 955.57 g (3.248 mol) of BPDA was added to the solution. The mixture was then allowed to polymerize for 2 hours with stirring to give a solution of polyimide precursor H which showed an apparent viscosity of 25 poises at 25° C. when measured by a B-type viscometer.

SYNTHETIC EXAMPLES 9–11

The polymerization reaction was carried out as in Synthetic Example 1 by using DMAc, diamines and acid anhydrides in the amounts specified below and stirring the reaction mixture for 3 hours to give polyimide precursor I (Synthetic Example 9), polyimide precursor J (Synthetic Example 10) and polyimide precursor K (Synthetic Example 11).

Synthetic Example 9: DMAc, 425 g; DADMB, 7.55 g (35.54 mmol); PPD, 15.37 g (142.17 mmol); BPDA, 52.08 g (177.01 mmol).

Synthetic Example 10: DMAc, 425 g; DADMB, 21.79 g (102.63 mmol); DAPE, 13.70 g (68.42 mmol); BPDA, 9.96 g (33.87 mmol); PMDA, 29.55 g (45.68 mmol).

Synthetic Example 11: DMAc, 425 g; DADMB, 17.58 g (82.79 mmol); PPD, 8.95 g (82.79 mmol); BPDA, 48.47 g (164.75 mmol).

EXAMPLE 1

A copper foil-polyimide laminate was prepared by applying the solution of polyimide precursor A prepared in Synthetic Example 1 manually to a copper foil (an electrolytic grade with a thickness of 35 μm, available from Mitsui Mining and Smelting Co., Ltd.) with the use of an applicator, drying the solution at 90° C. for 8 minutes, then heating it from 90° C. to 306° C. over a period of 54 minutes while raising the temperature at a rate of 4° C./min and finally at 360° C. for 2 minutes to form a 25 μm-thick layer of polyimide on the copper foil. A 5 cm×5 cm square cut from the laminate showed warpage of 1.34 mm. The copper foil was etched off from the laminate by an aqueous solution of ferric chloride to give a polyimide film, which showed a coefficient of linear hygroscopic expansion of $14.4 \times 10^{-6}$/% RH and a coefficient of linear thermal expansion of $40.5 \times 10^{-6}$/° C.

COMPARATIVE EXAMPLE 1

The laminate containing a 25 μm-thick polyimide layer produced as in Example 1 from the solution of polyimide precursor F of Synthetic Example 6 showed warpage of 2.40 mm. The 25 μm-thick polyimide film obtained from the laminate by etching as in Example 1 showed a coefficient of linear hygroscopic expansion of $25.6 \times 10^{-6}$/% RH and a coefficient of linear thermal expansion of $15.7 \times 10^{-6}$/° C.

EXAMPLES 2–7

Laminates containing a 25 μm-thick polyimide layer were produced from the solutions of polyimide precursors B, C, D, I, J and K prepared respectively in Synthetic Examples 2, 3, 4, 9, 10 and 11 and tested for warpage and the results are shown in Table 1. The 25 μm-thick polyimide films obtained by etching the laminates were measured for the coefficient of linear hygroscopic expansion and the coefficient of linear thermal expansion and the results are shown in Table 1 together with those of Example 1 and Comparative Example 1.

REFERENCE EXAMPLE 1

The 25 μm-thick polyimide film obtained as in Example 1 starting with the solution of polyimide precursor E of Synthetic Example 5 was measured for its coefficient of linear thermal expansion and the value is shown in Table 1. It is to be noted here, however, that the heat treatment was performed as follows, somewhat differently from Example 1: the solution was applied manually, dried at 90° C. for 8 minutes, heated from 90° C. to 306° C. over a period of 54 minutes while raising the temperature at a rate of 4° C./min, heated at 360° C. for 2 minutes and then further heated at 400° C. for 10 minutes.

TABLE 1

| Example No. | Precursor solution | Diamine | Acid anhydride | Warpage (mm) | Coeff. of hygroscopic expansion ($10^{-6}$/% RH) | Coeff. of thermal expansion ($10^{-6}$/°C.) |
|---|---|---|---|---|---|---|
| 1 | A | DADMB BAPB | BPDA | 1.3 | 14 | 41 |
| 2 | B | DADMB | BPDA | 1.0 | 10 | 14 |
| 3 | C | DADMB | 6 FDA PMDA | 0.4 | 11 | 0 |
| 4 | D | DADMB BAPB | BPDA | 0.7 | 10 | 18 |
| 5 | I | DADMB PPD | BPDA | 1.4 | 12 | 11 |
| 6 | J | DADMB DAPE | BPDA PMDA | 1.8 | 17 | 15 |
| 7 | K | DADMB PPD | BPDA | 1.2 | 11 | 21 |
| Ref. Ex. 1 | E | BAPP | BPDA | — | — | 58 |
| Comp. Ex. 1 | F | MABA DAPE | PMDA | 2.4 | 26 | 16 |

EXAMPLE 8

The solution of polyimide precursor H, or a precursor for polyimide of high thermal expansion, prepared in Synthetic Example 8 was applied uniformly to a roll of 18 μm-thick stainless steel foil (SUS304, tension-annealed, a product of Nippon Steel Corporation) to a thickness of 9 μm by the use of a knife coater and heated continuously in a hot-air oven at 130° C. to strip off the solvent. After this step, the solution of polyimide precursor G, or a precusor for polyimide of low hygroscopic expansion, was applied uniformly to the layer of precursor H to a thickness of 93 μm by the use of a knife coater and heated continuously in a hot-air oven at 130° C. to strip off the solvent. Thereafter, the solution of polyimide precursor H, or a precursor for polyimide of high thermal expansion, prepared in Synthetic Example 8 was applied uniformly to the layer of precursor G to a thickness of 14 μm by the use of a reverse roll coater and heated continuously in a hot-air oven at 130° C. to strip off the solvent. Following this, the coated foil was heated in a hot-air oven from 134° C. to 360° C. over a period of 17 minutes thereby effecting imidation to give a laminate in which layers of polyimides with a total thickness of 16.5 μm are formed on the stainless steel foil.

The laminate was tested as in Example 1 for warpage which was 1.0 mm.

The laminate was then stacked on a copper foil (18 μm-thick, available from Nikko Gould Foil Co., Ltd.) with the polyimide side facing the copper foil and the two were pressed at 150 kg/cm$^2$ and 330° C. for 20 minutes by the use of a vacuum press to prepare a double-sided laminate.

The laminate was etched by an aqueous solution of ferric chloride to obtain a polyimide film. The film showed a coefficient of linear hygroscopic expansion of $(9-11) \times 10^{-6}$/% RH and a coefficient of linear thermal expansion of $(23-24) \times 10^{-6}$/° C. (both measurements made at a total of four pointis, two in the center and two at the corners).

The polyimide layer obtained from the polyimide precursor of Synthetic Example 7 showed a coefficient of hygroscopic expansion of $9.8 \times 10^{-6}$/% RH and a coefficient of thermal expansion of $18 \times 10^{-6}$/° C. The coefficient of thermal expansion of the polyimide layer from the polyimide precursor of Synthetic Example 8 was $58 \times 10^{-6}$/° C.

COMPARATIVE EXAMPLE 2

A laminate possessing layers of polyimides with a total thickness of 16.5 μm on a 18 μm-thick stainless steel foil was prepared as in Example 8 except using polyimide precursor F of Synthetic Example 6 in place of polyimide precursor G of Synthetic Example 7.

The laminate showed warpage of 1.9 mm when measured as in Example 1.

It is apparent that the presence of a resin layer of low hygroscopic expansion in the laminate obtained in Example 8 accounts for small warpage in response to a change in ambient humidity and makes the laminate suitable for use in base materials for HDD suspensions.

INDUSTRIAL APPLICABILITY

The laminate of this invention is a humidity-resistant laminate which is free from problems originating from an adhesive layer and exhibits good dimensional stability against humidity effectively suppressing warpage when a change occurs in humidity. This humidity-resistant laminate can be used widely in parts of electronic materials because of its good dimensional stability in response to environmental change. In particular, the laminate is best suited for flexible printed wiring boards and HDD suspensions. Furthermore, this invention provides a process which is effective for producing a laminate of good dimensional stability and applicable commercially.

What is claimed is:

1. A laminate comprising a layer of polyimide or layers of polyimides formed on a conductor by coating, wherein at least one of said polyimide layers is a polyimide layer of low hygroscopic expansion obtained by the reaction of diamines containing 20 mol % or more of 4,4'-diamino-2,2'-dimethylbiphenyl with a tetracarboxylic acid compound and exhibiting a coefficient of linear hygroscopic expansion of $20 \times 10^{-6}$/% RH or less.

2. The laminate as described in claim 1, wherein the coefficient of linear hygroscopic expansion of the polyimide layer of low hygroscopic expansion is $15 \times 10^{-6}$/% RH or less.

3. The laminate as described in claim 1, wherein the polyimide layer has a multilayer structure composed of at least two layers, one being a polyimide layer of low hygroscopic expansion exhibiting a coefficient of linear hygroscopic expansion of $20 \times 10^{-6}$/% RH or less, and the other being a polyimide layer of high thermal expansion exhibiting a coefficient of linear thermal expansion of $30 \times 10^{-6}$/° C. or more, and wherein the polyimide of high thermal expansion is in contact with the conductor layer.

4. The laminate as described in claim 1, wherein the polyimide layer has a three-layer structure composed of a polyimide layer of high thermal expansion, a polyimide layer of low hygroscopic expansion, and a polyimide layer of high thermal expansion.

5. The laminate as described in claim 1, wherein the polyimide layer of low hygroscopic expansion is a layer of polyimide containing 20 mol % or more of the structural unit represented by the following formula (1) and/or formula (2)

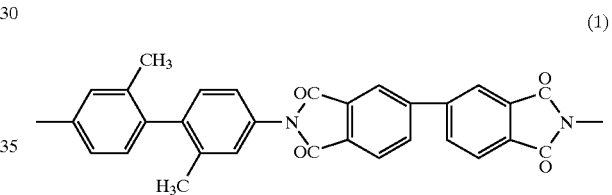

(1)

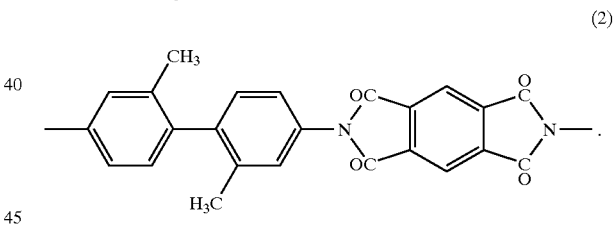

(2)

6. The laminate as described in claim 1, wherein the polyimide layer of low hygroscopic expansion further exhibits a coefficient of linear thermal expansion of $25 \times 10^{-6}$/° C. or less.

7. The laminate as described in claim 1, wherein the diamines contains 50 mol % or more of 4,4'-diamino-2,2'-dimethylbiphenyl.

8. The laminate as described in claim 3, wherein the polyimide layer of high thermal expansion has a thickness of ⅓ or less of that of the resin layers as a whole.

9. A process for producing the laminate as described in claim 1, which process comprises coating a conductor with a solution of polyimide precursor or polyimide obtained by the reaction of diamines containing 20 mol % or more of 4,4'-diamino-2,2'-dimethylbiphenyl with a tetracarboxylic acid compound, drying the solution, and giving heat treatment at a temperature above 200° C. to form a polyimide layer of low hygroscopic expansion with a coefficient of linear humidity coefficient of $20\times10^{-6}$/% RH or less on the conductor.

10. The process as described in claim 9, which comprises coating a conductor with a solution of resin precursor or resin capable of yielding polyimide of high thermal expansion with a coefficient of linear thermal expansion of $30\times10^{-6}$/° C. or more and then with a solution of resin precursor or resin capable of yielding polyimide of low hygroscopic expansion with a coefficient of linear hygroscopic expansion of $20\times10^{-6}$/% RH or less, drying the solutions to form plural layers of resins, and giving heat treatment at a temperature above 200° C. to form polyimide layers possessing at least one layer of polyimide of low hygroscopic expansion with a coefficient of linear hygroscopic expansion of $20\times10^{-6}$/% RH or less.

11. A process for producing a double-sided laminate possessing conductors on both sides, which process comprises coating a conductor with a solution of resin precursor or resin according to the process as described in claim 10 so that the polyimide of high thermal expansion constitutes the layer in contact with the conductor layer and the layer on the surface, drying the solutions to form plural layers of resins, giving heat treatment at a temperature above 200° C. to form a single-sided laminate possessing a conductor layer on one side, and hot-pressing another conductor layer to the single-sided laminate.

* * * * *